United States Patent
Kanamoto et al.

(10) Patent No.: US 6,504,186 B2
(45) Date of Patent: *Jan. 7, 2003

(54) SEMICONDUCTOR DEVICE HAVING A LIBRARY OF STANDARD CELLS AND METHOD OF DESIGNING THE SAME

(75) Inventors: Toshiki Kanamoto, Tokyo (JP);
Yoshihide Ajioka, Tokyo (JP);
Yukihiko Shimazu, Tokyo (JP);
Hideyuki Hamada, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,379

(22) Filed: Jun. 4, 1998

(65) Prior Publication Data

US 2001/0011734 A1 Aug. 9, 2001

(30) Foreign Application Priority Data

Dec. 24, 1997 (JP) .............................................. 9-354603

(51) Int. Cl.⁷ .............................................. H01L 27/10
(52) U.S. Cl. ........................ 257/202; 257/203; 257/356
(58) Field of Search ................................. 257/202, 203, 257/209, 211, 356, 360, 361, 362, 363; 438/214

(56) References Cited

U.S. PATENT DOCUMENTS 3,943,551 A * 3/1976 Skorup ........................ 357/42
4,161,662 A * 7/1979 Malcolm et al. ............. 307/231
4,484,212 A   11/1984 Komatsu et al.
4,568,961 A * 2/1986 Noto ............................ 357/45
4,893,157 A   1/1990 Miyazawa et al.
5,031,019 A * 7/1991 Kosaka et al. ................ 357/43
5,166,770 A * 11/1992 Tang et al. ................... 257/770
5,214,299 A * 5/1993 Gal et al. ..................... 257/208
5,605,854 A   2/1997 Yoo
5,700,722 A   12/1997 Sumi
5,760,445 A * 6/1998 Diaz ............................ 257/356
5,844,282 A * 12/1998 Noguchi ...................... 257/356

FOREIGN PATENT DOCUMENTS

| DE | 19 49 484 | 2/1978 |
| DE | 31 43 565 A1 | 5/1983 |
| GB | 2 113 915 A | 8/1983 |
| JP | 63-226111 | 9/1988 |
| JP | 5-36950 | 2/1993 |
| JP | 6-216252 | 8/1994 |

* cited by examiner

Primary Examiner—Sara Crane
(74) Attorney, Agent, or Firm—McDermott, Will & Emery

(57) ABSTRACT

In a semiconductor device provided with a plurality of standard cells each comprising an input terminal and MOS transistors, a diffused region having a substantially negligibly small resistance is formed in a semiconductor substrate, and the input terminal of the standard cell and gates of the MOS transistors are connected through the diffused region. Also, a diffused region is formed under the input terminal in the substrate, and the input terminal is connected to the diffused region. In a modification, another standard cell is formed by forming a diffused region and a metal layer connected to the diffused region on the substrate, and the another standard cell is connected to the input terminal.

1 Claim, 15 Drawing Sheets

SEMICONDUCTOR DEVICE HAVING A LIBRARY OF STANDARD CELLS AND METHOD OF DESIGNING THE SAME

BACKGROUND OF THE INVENTION

1. Field of the Invention

The present invention relates to a semiconductor device provided with a library of standard cells which include MOS transistors and the gates of the MOS transistors have not undergone plasma damages. The present invention also relates to a method of designing such a semiconductor device.

More specifically, the present invention relates to a structure of a semiconductor devise and a method of designing such a structure which prevents gates of MOS transistors from undergoing plasma damage in a wafer process in fabricating a semiconductor device.

2. Background Art

FIG. 23 is a plan view showing a conventional standard cell layout pattern employed in auto-placement and auto-routing for a semiconductor device comprising a plurality of standard cells. Referring to FIG. 23, a standard cell has an n-type well 3 formed in a p-type silicon substrate 1. A p-type diffused region 4 is formed in the n-type well 3. An n-type diffused region 5 is formed in the p-type silicon substrate 1. A polysilicon wiring line 8, including gate electrodes 8g, is formed on the gate insulating film (not shown) on the wafer 1. Thus, MOS transistors T1 and T2 are formed. The polysilicon wiring line 8 is connected through a contact hole 11 to a metal wiring line 10, which serves as an input terminal or an input line.

In the conventional standard cell for auto-placement and auto-routing in a gate array and cell base type semiconductor devise, a pattern of the metal wiring line 10 connected to the gates of a MOS transistor T1 or T2 is used as an input terminal or an input line.

In the above-mentioned conventional configuration, a wiring line connected to the input terminal 10 or the input line may be long and run outside the conventional standard cell. In that case, the gate oxide film of the MOS transistor T1 or T2 is liable to be damaged by electrons launched from a plasma into the metal wiring line during wafer processing such as an etching of the metal wiring line or a removal of the resist. This eventually has resulted in a deterioration of the transistor characteristics.

SUMMARY OF THE INVENTION

The present invention has been made to solve the foregoing problems in the prior art, and it is therefore an object of the present invention to provide a semiconductor device comprising MOS transistors having gates not damaged by a plasma. Another object of the present invention is to provide a method of designing and fabricating such a semiconductor device.

According to one aspect of the present invention, a semiconductor device has a library of standard cells formed on a substrate. Each of the standard cell includes at least a MOS transistor and an input line for the MOS transistor. The semiconductor device further comprises a diffused region formed in the substrate, an insulating layer formed on the substrate, a metallic layer formed on the insulating layer, and a contact portion connecting the metallic layer with the diffused region through the insulating layer.

In another aspect of the present invention, in the semiconductor device, the metallic layer is divided in two portions, and each of the portions is connected to the diffused region through the insulating layer.

In another aspect of the present invention, in the semiconductor device, the diffused region is silicidized.

In another aspect of the present invention, in the semiconductor device, the input line is connected with the metallic layer.

In another aspect of the present invention, in the semiconductor device, the input line is divided in two sides, and each of the two sides is connected to each of the two portions of the metallic layer respectively.

In another aspect of the present invention, in the semiconductor device, an auxiliary cell is formed by the diffused layer, the insulating layer, the metallic layer, and the contact portion.

In another aspect of the present invention, in the semiconductor device, a plurality of the auxiliary cells are provided as a library.

In another aspect of the present invention, in the semiconductor device, the auxiliary cell is formed as a transmission gate including at least a MOS transistor.

In another aspect of the present invention, in the semiconductor device, the transmission gate is comprised of a PMOS transistor and a NMOS transistor.

In another aspect of the present invention, in the semiconductor device, the transmission gate has an input terminal and an output terminal electrically connected to each other.

According to another aspect of the present invention, in a method of designing a semiconductor device, a library of standard cells including at least a MOS transistor is disposed on a substrate by using a software tool including either a symbolic layout tool or a module generator tool. Further, a plurality of diffused regions is disposed on the semiconductor substrate so that each gate of the MOS transistor may be connected to a selected one of the diffused regions.

Other and further objects, features and advantages of the invention will appear more fully from the following description.

BRIEF DESCRIPTION OF THE DRAWINGS

FIG. 1 is a plan view showing a layout pattern of a standard cell, FIG. 2 is a sectional view taken on II—II line in FIG. 1, and FIG. 3 is a sectional view taken on III—III line in FIG. 1.

FIG. 4 is a plan view showing a layout pattern of a standard cell, and FIG. 5 is a sectional view taken on V—V line in FIG. 4.

FIG. 6 is a plan view showing a layout pattern of a standard cell, and FIG. 7 is a sectional view taken on VII—VII line in FIG. 6.

FIG. 8 is a plan view showing a layout pattern of a standard cell, and FIG. 9 is a sectional view taken on IX—IX line in FIG. 8.

FIG. 10 is a plan view showing a layout pattern of a standard cell and additional standard cells, FIG. 11 is a sectional view taken on XI—XI line in FIG. 10, FIG. 12 is a sectional view taken on XII—XII line, FIG. 13 is a sectional view taken on XIII—XIII line in FIG. 10, and FIG. 14 is a sectional view taken on XIV—XIV line in FIG. 10.

FIG. 15 is a plan view showing a layout pattern produced at the time of the auto-placement and auto-routing.

FIG. 16 is a plan view showing a layout pattern of an additional standard cell newly added to an ordinary standard cell library.

FIG. 17 is a plan view showing a layout pattern of an additional standard cell newly added to an ordinary standard cell library.

FIG. 18 is a plan view showing a layout pattern of the standard cell.

FIG. 19 is a plan view showing a layout pattern produced by an automatic layout producing program, such as a symbolic layout program or a module generator program.

FIG. 21 is a plan view showing a layout pattern of a standard cell and metal wiring lines, and FIG. 22 is a sectional view taken on XXII—XXII line in FIG. 21.

BEST MODE OF CARRYING OUT THE INVENTION

Figure 1:
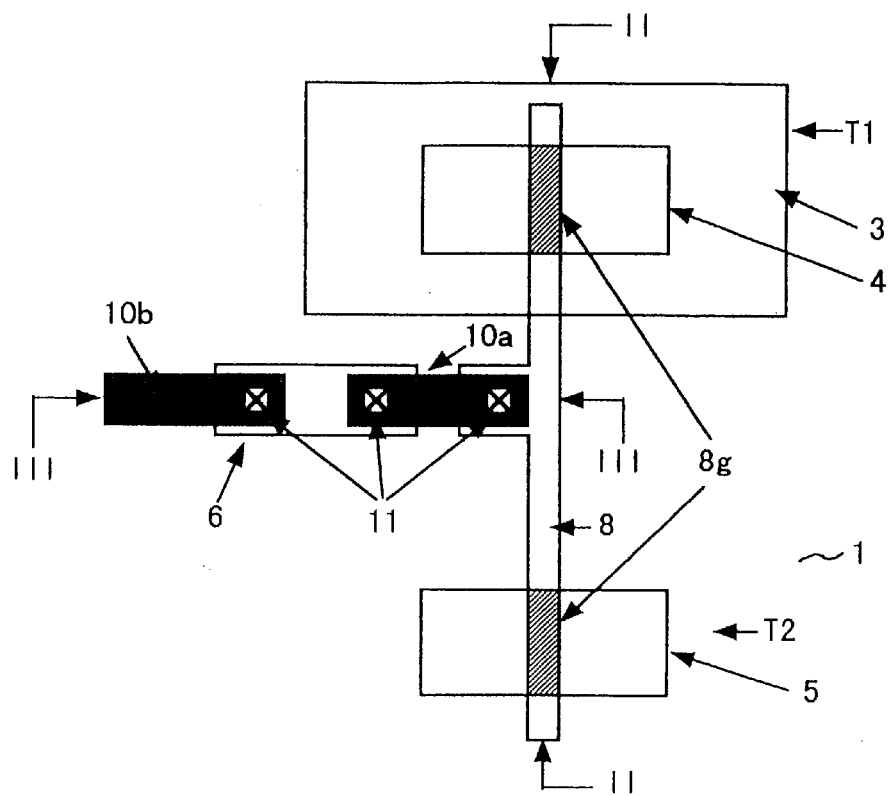
FIGS. 1, 2, and 3 show a configuration of a semiconductor device according to a first embodiment of the present invention.

Preferred embodiments of the present invention will be described hereinafter with reference to the accompanying drawings in which the same or corresponding parts are designated by the same reference numerals.

First Embodiment

Figure 2:
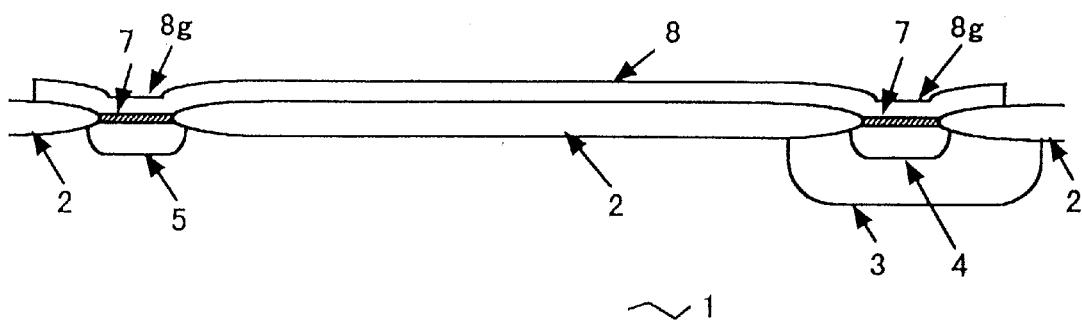
Figure 3:
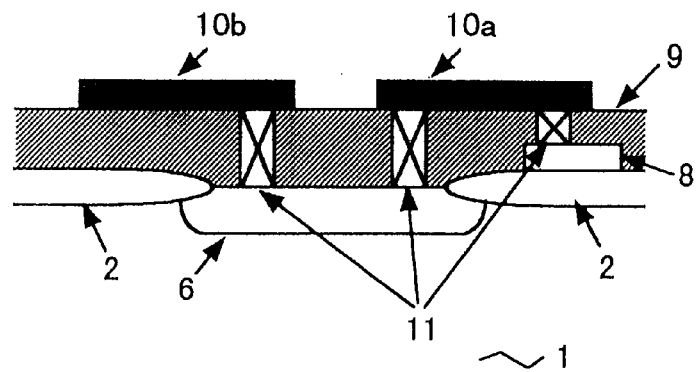

FIGS. 1, 2, and 3 are diagrams for illustrating a configuration of a semiconductor device according to a first embodiment of the present invention. FIG. 1 is a plan view showing a layout pattern of a standard cell, FIG. 2 is a sectional view taken on II—II line in FIG. 1, and FIG. 3 is a sectional view taken on III—III line in FIG. 1.

Referring to FIGS. 1 to 3, there are shown a p-type silicon semiconductor substrate 1 (hereinafter referred to as p-substrate, or substrate, when appropriate), an isolation oxide film 2 formed on a surface of the p-substrate 1, an n-type well 3 (hereinafter referred to as n-well, when appropriate) formed in the p-substrate 1, a p-type diffused region 4 formed in the n-well 3, an n-type diffused region 5 formed in the p-substrate 1, and another n-type diffused region 6 formed in the p-substrate 1.

Shown also in FIGS. 1 to 3 are a gate oxide film 7 formed on the p-type diffused region 4 and the n-type diffused region 5, a polysilicon wiring line 8, gate electrodes 8g, i.e., portions of the polysilicon wiring line 8, formed on the gate oxide film 7, interlayer insulating oxide film 9, metal wiring lines 10a and 10b formed on the interlayer insulating oxide film 9, and contact holes (or contacts) 11 for connecting the metal wiring line 10a to the polysilicon wiring line 8 or for connecting the metal wiring lines 10a and 10b to the n-type diffused region 6.

In the p-type diffused region 4 and/or the n-type diffused region 5, source regions or drain regions doped with impurities are formed on the both sides of the gate electrodes 8g respectively, although not shown. Thus, the source/drain regions in the p-type diffused region 4, the gate oxide film 7 and the gate electrode 8g form a MOS transistor T1. The source/drain regions in the n-type diffused region 5, the gate oxide film 7 and the gate electrode 8g form another MOS transistor T2.

In this embodiment, the input line is separated in the metal wiring lines 10a and 10b. The metal wiring line 10a is connected to the gates 8g, and the metal wiring line 10b works as a input metal terminal. The metal wiring line 10a and metal wiring line 10b are connected by the diffused region 6 serving as a diffused wiring line. The diffused region 6 is formed so that its resistance can be substantially neglected in terms of circuit operation.

Although the diffused region 6 and the wafer 1 forms a diode at the junction, no current flows through the junction while the LSI circuit is in normal operation.

In case a large amount of electrons flow into the metal wiring lines 10a and 10b during wafer processing, the electrons flows through the diode into the wafer 1. Therefore, the gate oxide film 7 of the MOS transistor T1 or T2 is not damaged. In this embodiment, the diffused wiring line is inserted between the input terminal and the gate of the MOS transistor of the standard cell employed in a design system such as a gate array and cell base system. This allows electrons, which flow into the metal wiring lines during the processing, to dissipate into the wafer, thus making it possible to protect the gates.

Second Embodiment

Figure 4:
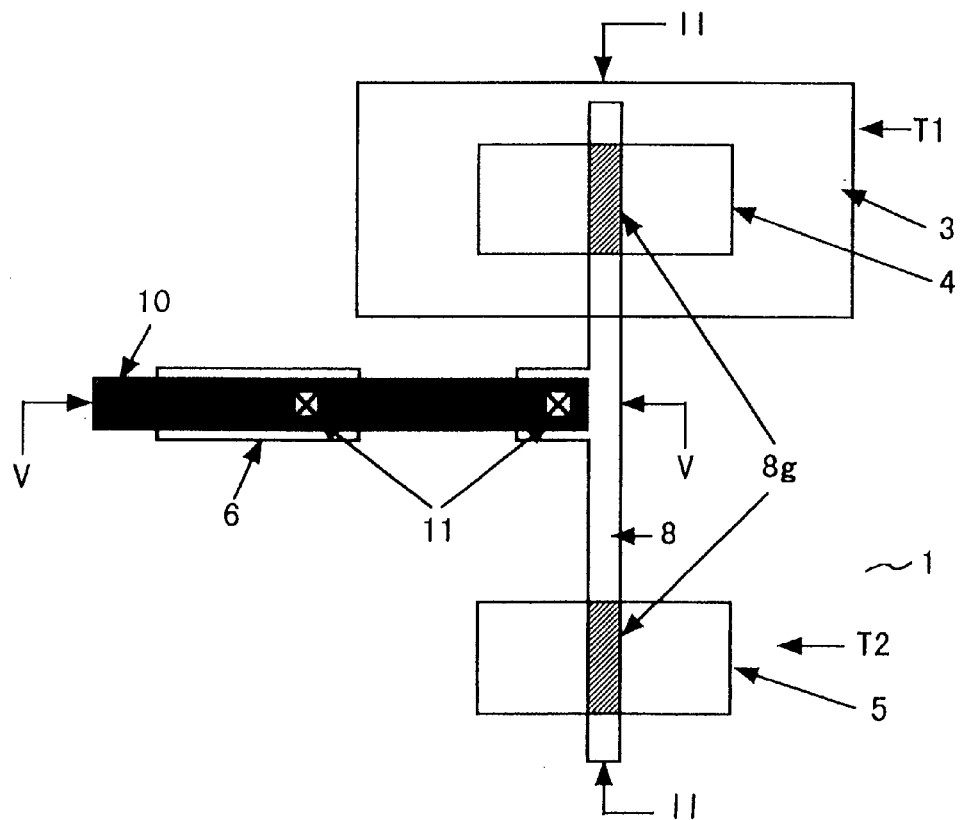
FIGS. 4 and 5 shows the configuration of a semiconductor device according to a second embodiment of the present invention.
Figure 5:
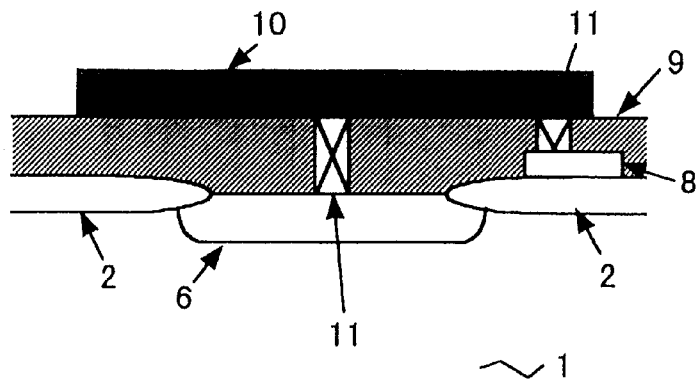

FIGS. 4 and 5 shows the configuration of a semiconductor device according to a second embodiment of the present invention. FIG. 4 is a plan view showing a layout pattern of a standard cell, and FIG. 5 is a sectional view taken on V—V line in FIG. 4. A sectional view taken on II—II line in FIG. 4 is similar to the sectional view shown in FIG. 2.

Referring to FIGS. 4 and 5, a metal wiring line 10 works as an input line for the MOS transistor in the standard cell. In FIGS. 4 and 5, components like or corresponding to those shown in FIGS. 1 to 3 are designated by the same reference numerals, and the description thereof will be omitted to avoid duplication.

In this second embodiment, the metal wiring line 10 serving as an input terminal is not cut. However, a diffused region 6 is formed under the metal wiring line (or metal terminal) 10, and the metal wiring line 10 is connected through a contact hole 11 to the diffused region 6.

Although the junction of the diffused region 6 and the wafer 1 forms a diode, no current flows through the junction while the LSI circuit is in normal operation.

During wafer processing, even if a large amount of electrons flow into the metal wiring line 10, the electrons dissipate through the diode into the wafer 1, so that the gate oxide films 7 of the MOS transistors T1 and T2 are not damaged.

Since the resistance of the input line in the second embodiment is lower than that of the input line in the first embodiment in which the diffused wiring line is employed, the influence on wire delay time is reduced.

As described above, in the second embodiment, the diffused region is formed under the metal wiring line and is connected through a contact to the metal wiring line, thereby eliminating the resistance component in the diffused wiring line. Thus, electrons, which flow into the metal wiring line during the processing, are dissipated. Influence on wire delay time is eliminated. Further, the gate is protected.

Third Embodiment

Figure 6:
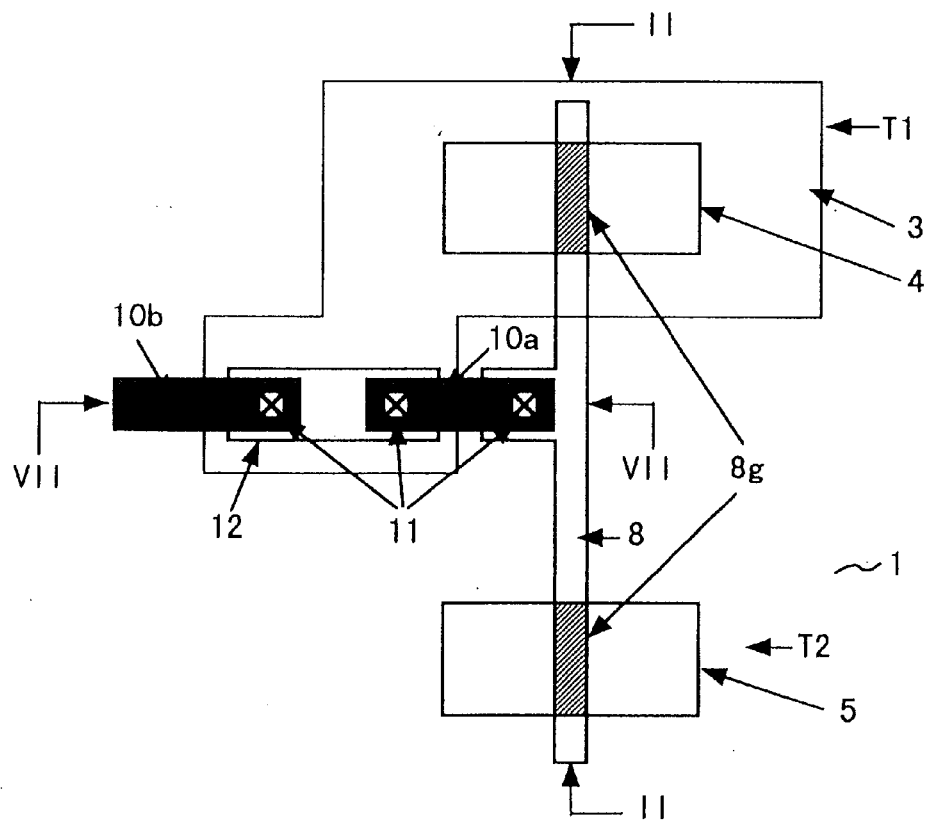
FIGS. 6 and 7 shows a configuration of a semiconductor device according to a third embodiment of the present invention.
Figure 7:
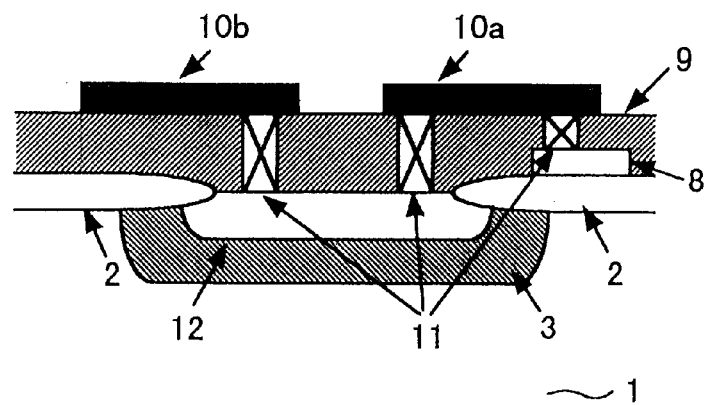

FIGS. 6 and 7 shows a configuration of a semiconductor device according to a third embodiment of the present invention. FIG. 6 is a plan view showing a layout pattern of a standard cell, and FIG. 7 is a sectional view taken on VII—VII line in FIG. 6. A sectional view taken on II—II line in FIG. 6 is similar to the sectional view shown in FIG. 2.

Referring to FIGS. 6 and 7, a relatively large n-type well 3 is formed in p-substrate 1, and a p-type diffused region 12 is formed on the surface of the n-type well 3. In FIGS. 6 and 7, and in the succeeding figures, well contacts are not shown for simplicity.

In the third embodiment, a metal wiring line, which serves as an input line (input terminal), is divided into metal wiring lines 10a and 10b. The metal wiring line 10a is connected to gates 8g, and the metal wiring line 10b serves as a metal terminal. The metal wiring line 10a and 10b are connected by a p-type diffused region 12 formed on the surface of the n-type well 3. The resistance component of the diffused region 12 serving as a diffused wiring line can be substantially neglected in terms of circuit operation.

Although the junction of the p-type diffused region 12 and the n-type well forms a diode, no current flows through the junction while the LSI circuit is in normal operation.

Even when a large amount of electrons flow into the metal wiring lines 10a and 10b during wafer processing, the electrons flow through the diode into the n-well 3 having opposite conductivity to that of the wafer 1, so that the gate oxide films 7 of the MOS transistors T1 and T2 are not damaged.

Fourth Embodiment

Figure 8:
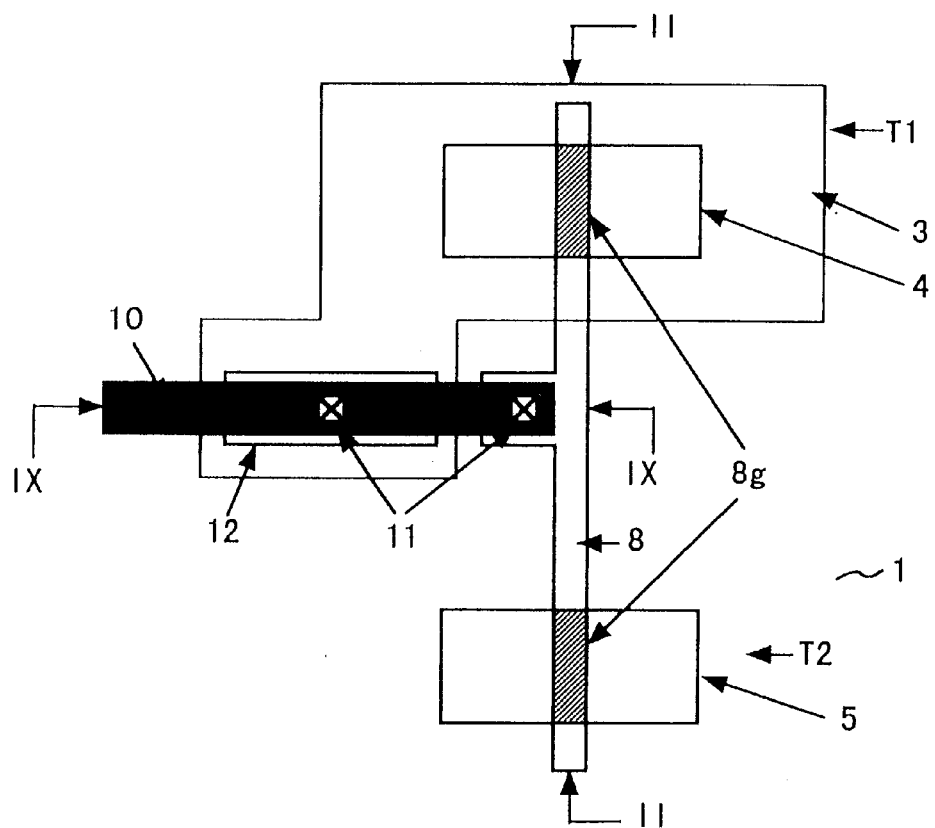
FIGS. 8 and 9 show a configuration of a semiconductor device according to a fourth embodiment of the present invention.
Figure 9:
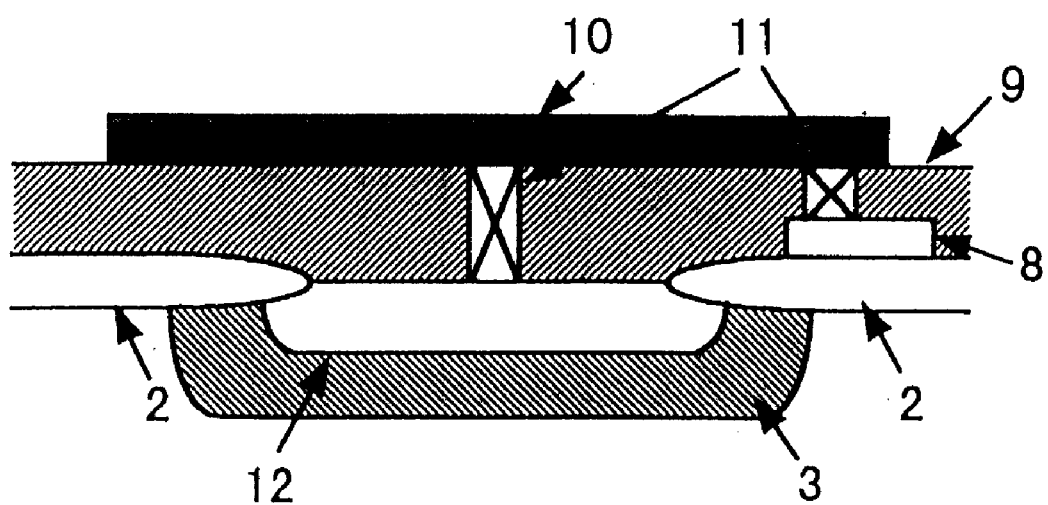

FIGS. 8 and 9 show a configuration of a semiconductor device according to a fourth embodiment of the present invention. FIG. 8 is a plan view showing a layout pattern of a standard cell, and FIG. 9 is a sectional view taken on IX—IX line in FIG. 8. A sectional view taken on II—II line in FIG. 8 is similar to the sectional view shown in FIG. 2.

In the fourth embodiment, a pattern of a metal wiring line 10, which is to operate as an input terminal, is not cut. A p-type diffused region 12 is formed under the metal wiring line 10 and on an n-type well 3 having the opposite conductivity to that of the p-substrate 1, and the metal wiring line 10 is connected through a contact hole 11 to the p-type diffused region 12.

Although the junction of the p-type diffused region 12 and the n-type well 3, having the opposite conductivity to that of the p-type diffused region 12, forms a diode, no current flows through while the LSI circuit is in normal operation.

If a large amount of electrons flow into the metal wiring line 10 during wafer processing, the electrons flow through the diode into the n-type well 3, so that the gate oxide films 7 of MOS transistors T1 and T2 are not damaged.

Since the resistance of the input line in the present embodiment is lower than that of the input line in the third embodiment in which the diffused region 12 is employed as the diffused wiring line, the influence on wire delay time is reduced.

Fifth Embodiment

Figure 10:
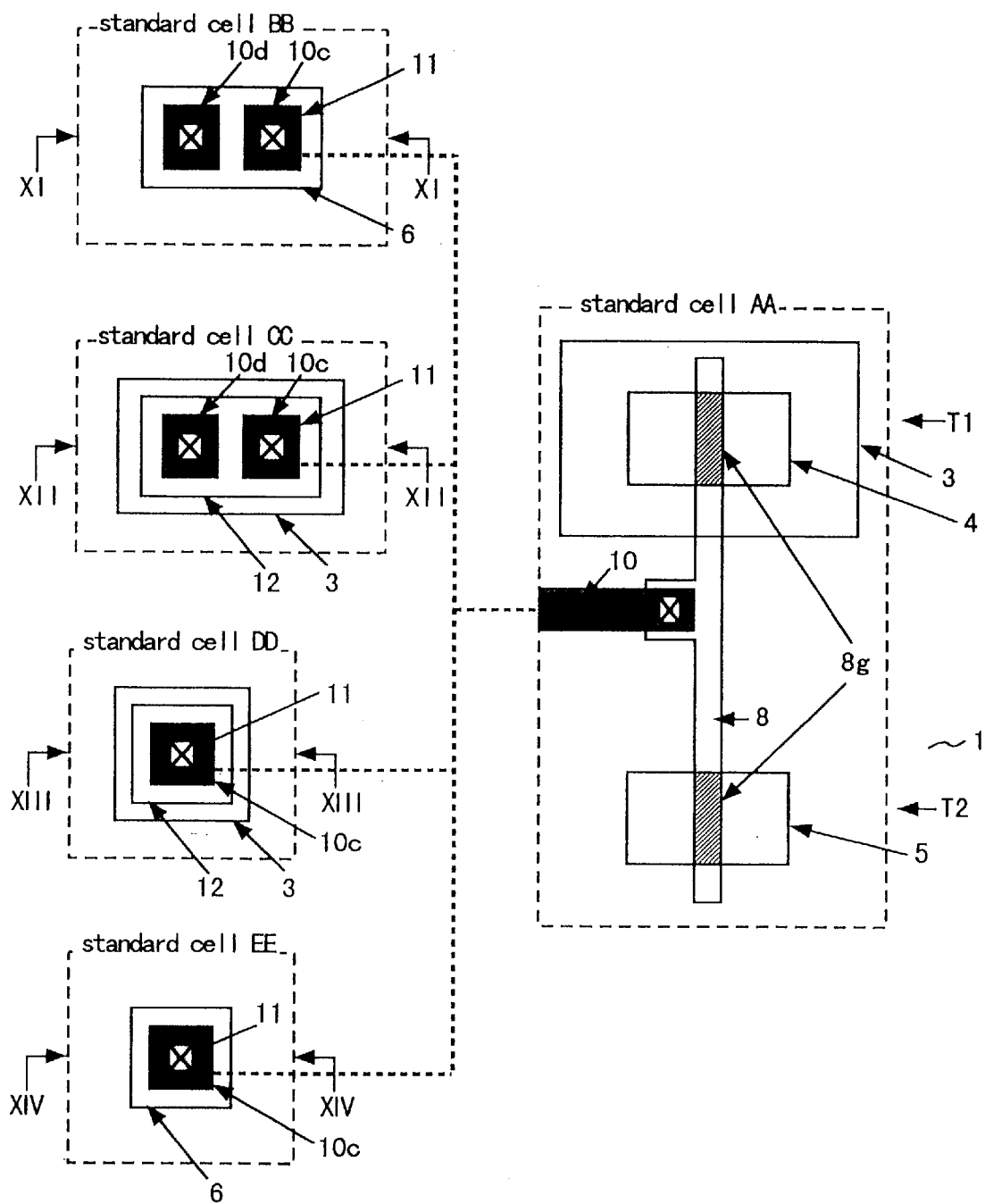
FIGS. 10 to 14 show a configuration of a semiconductor device according to a fifth embodiment in the present invention.
Figure 11:
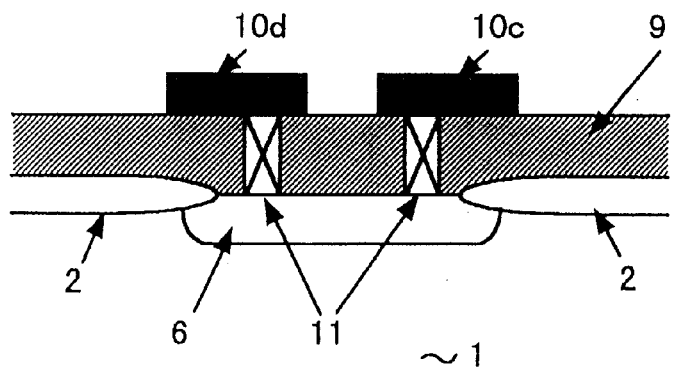
Figure 12:
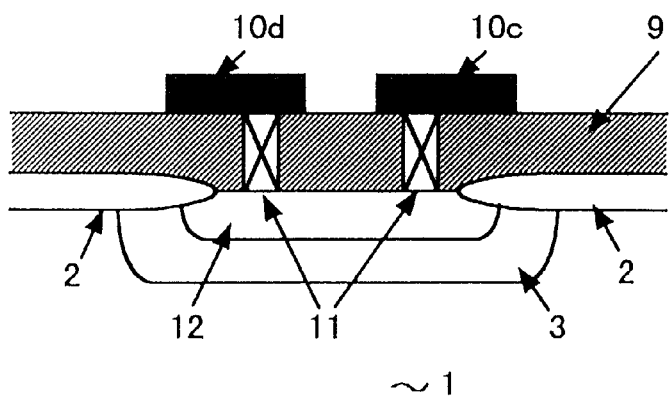
Figure 13:
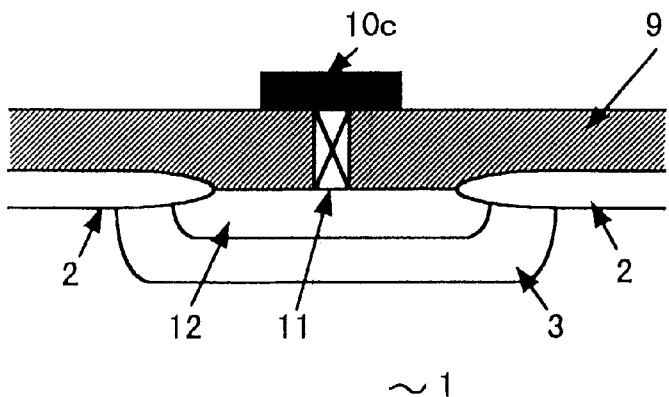
Figure 14:
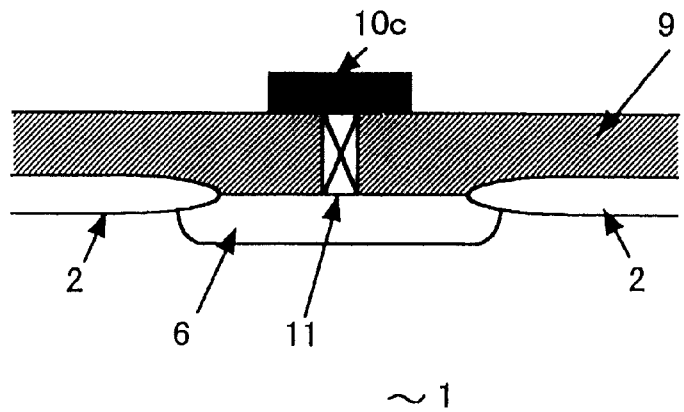

FIGS. 10 to 14 show a configuration of a semiconductor device according to a fifth embodiment in the present invention. FIG. 10 is a plan view showing a layout pattern of a standard cell and additional standard cells, FIG. 11 is a sectional view taken on XI—XI line in FIG. 10, FIG. 12 is a sectional view taken on XII—XII line, FIG. 13 is a sectional view taken on XIII—XIII line in FIG. 10, and FIG. 14 is a sectional view taken on XIV—XIV line in FIG. 10.

In the fifth embodiment, a standard cell library includes, in addition to an ordinary standard cell similar to those of the first to the fourth embodiment, the following additional standard cells.

As shown in FIGS. 10 to 14, a standard cell BB comprises an n-type diffused region 6, metal terminals 10c and 10d, and contact holes 11. A standard cell CC comprises an n-type well 3, a p-type diffused region 12 formed in the n-type well 3, metal terminals 10c and 10d, and contact holes 11. A standard cell DD comprises an n-type well 3, a p-type diffused region 12 formed in the n-type well 3, a metal terminal 10c, and a contact hole 11. A standard cell EE comprises an n-type diffused region 6, a metal terminal 10c and a contact hole 11.

Any one of the standard cells BB, CC, DD and E may be disposed at the time of the auto-placement and auto-routing near the standard cell AA having gates to be protected. Any standard cell among the standard cells BB, CC, DD and EE is connected via a metal wiring line 10e and through a metal wiring line 10 serving as an input line for the standard cell AA to the input gates of MOS transistors T1 and T2.

If a large amount of electrons flow into the metal wiring line 10 during wafer processing, the electrons flow through the diode into the wafer 1 or an n-type well 3 having the opposite conductivity to that of the wafer 1, so that the gate oxide films 7 of the MOS transistors T1 and T2 are not damaged.

It is desirable to dispose the standard cells BB, CC, DD and EE in proximity to the input gate to be protected. The proximity means a range in which the area or the circumferential length of the metal wiring line for connecting the input terminal of the standard cell and a newly disposed cell or pattern is not great enough to cause plasma damage. This is generally determined by the ratio of the area or the circumferential length of the metal wiring line to an area or a circumferential length of the gate of the MOS transistors in the standard cell.

As described above, in the present embodiment, an independent standard cell having the diffused region, the contact hole and the metal wiring line is provided, and, at the time of the auto-placement and auto-routing, the standard cell is disposed and connected in proximity to the gate to be protected. This makes it possible to dissipate electrons into the wafer or the wells in the wafer, when electrons flow into the metal wiring line during the processing. Thus, the gates are protected.

Sixth Embodiment

Figure 15:
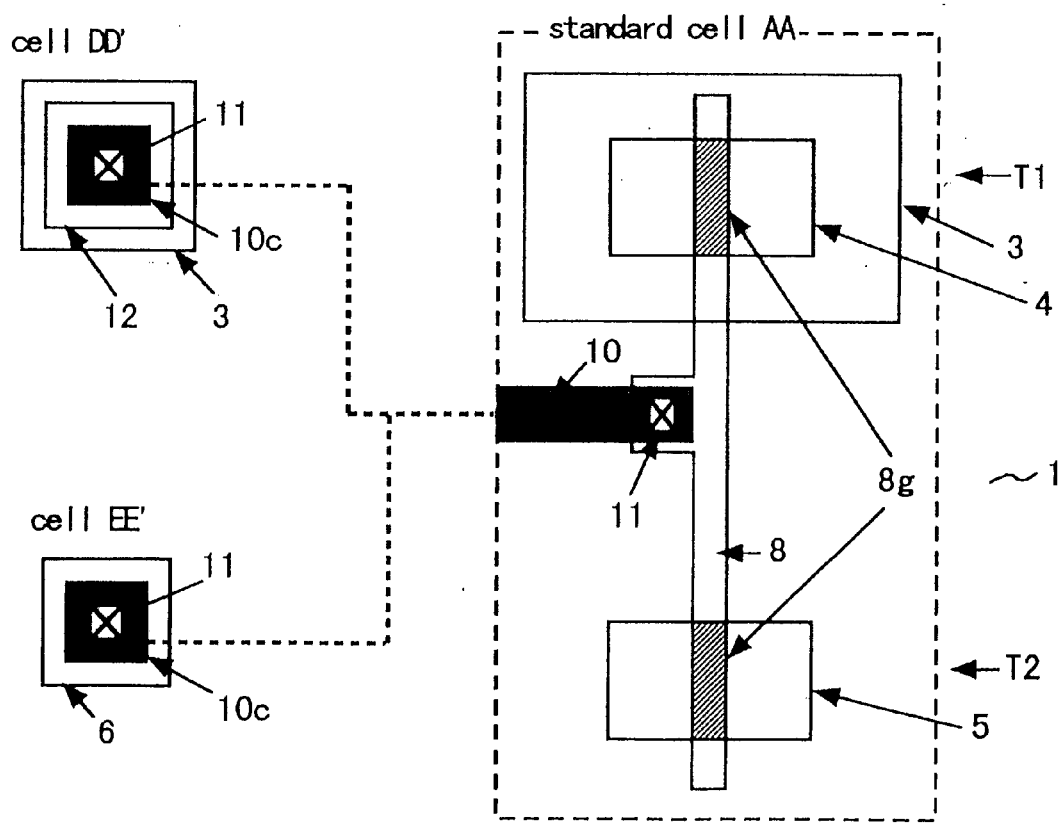
FIG. 15 shows a configuration of a semiconductor device according to a sixth embodiment of the present invention.

FIG. 15 shows a configuration of a semiconductor device according to a sixth embodiment of the present invention. FIG. 15 is a plan view showing a layout pattern produced at the time of the auto-placement and auto-routing.

In the sixth embodiment, the semiconductor device has a standard cell AA as the library, which is similar to that of the first to the fourth embodiments. In addition, a new cell which will be described below is formed at the time of the auto-placement and auto-routing in the semiconductor device including the standard cell. The new cell will be described below.

As shown in FIG. 15, a cell DD' comprises a p-type diffused region 12 formed in the n-type well 3, a metal terminal 10c and a contact hole 11. A cell EE' comprises an n-type diffused region 6, a metal terminal 10c and a contact hole 11. The construction of the cells DD' and EE' are the same as that of the cells DD and EE shown in FIG. 10, and hence the illustration of the cells DD' and EE' in sectional views will be omitted.

Either the cell DD' or EE' is formed automatically in proximity to the standard cell AA having an input gate to be protected, and is connected to the input gates of the MOS transistors T1 and T2 by a metal wiring line 10e through a metal wiring line 10 serving as the input line of the standard cell AA.

The junction of the automatically produced n-type diffused region 6 and a p-type wafer 1 or the junction of the p-type diffused region 12 and an n-type well 3 forms a diode. However, no current flows through the junction while the LSI circuit is in normal operation.

If a large amount of electrons flow into the metal wiring line 10 during wafer processing, the electrons will flow through the diode into the p-type wafer 1 or an n-type well 3, so that the gate oxide films 7 of the MOS transistors T1 and T2 are not damaged.

Thus, in the sixth embodiment, in the semiconductor device including the standard cell, a new layout pattern is formed to protect the input gate at the time of the auto-placement and auto-routing.

Seventh Embodiment

Figure 16:
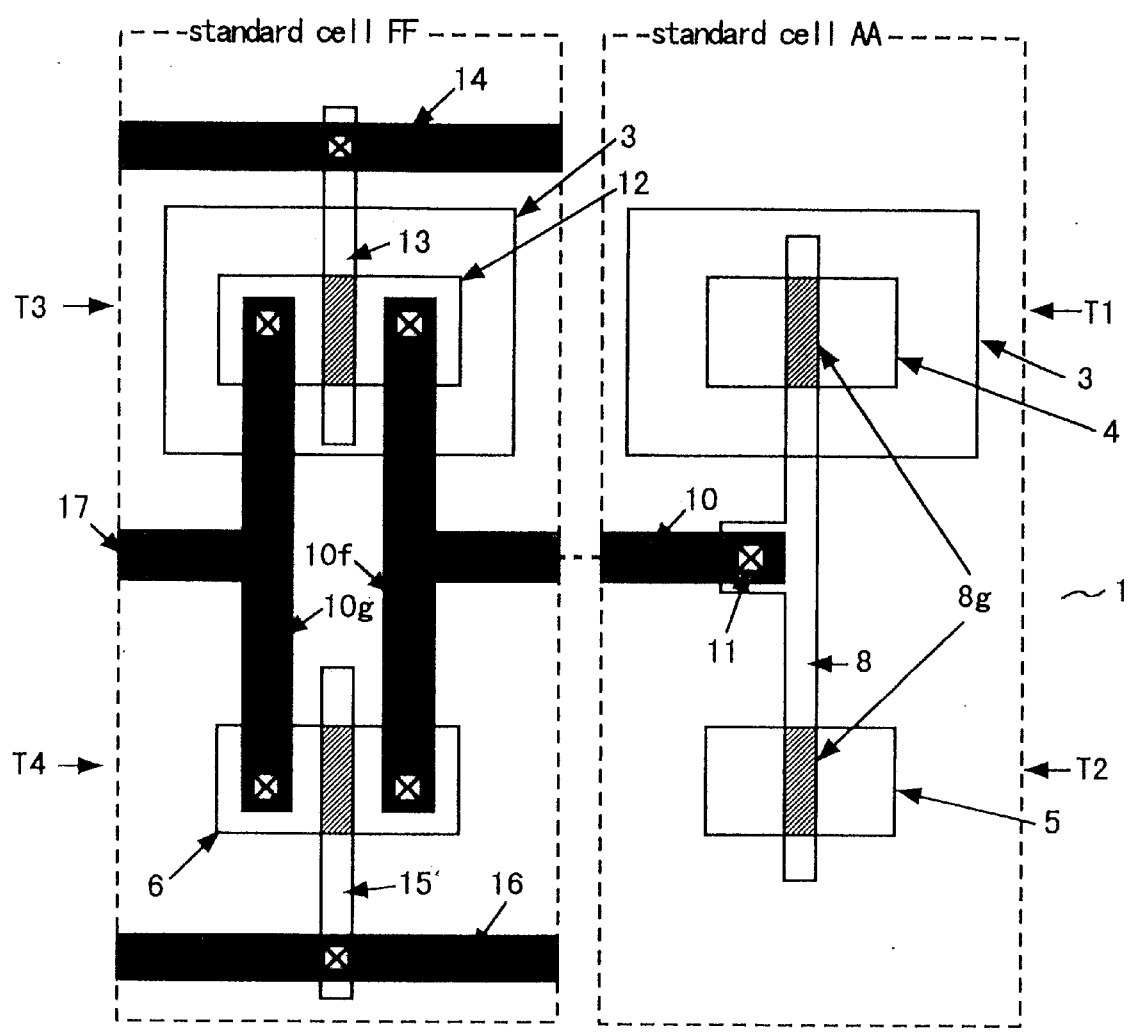
FIG. 16 shows a configuration of a semiconductor device according to a seventh embodiment of the present invention.

FIG. 16 shows a configuration of a semiconductor device according to a seventh embodiment in the present invention. FIG. 16 is a plan view showing a layout pattern of an additional standard cell newly added to an ordinary standard cell library.

The seventh embodiment is provided, in addition to the library a standard cell AA as mentioned in the description of the first to the fourth embodiments, with another standard cell having a transmission gate.

As shown in FIG. 16, an additional standard cell FF has a transmission gate formed by connecting a gate line 13 included in a p-channel MOS transistor T3 to a grounding line 14, and by fixing a gate line 15 included in an n-channel MOS transistor T4 to a power line 16. The source/drain regions of the transistors T3 and T4 are connected with each other by metal wiring lines 10f and 10g. Indicated at 17 is the input terminal of the transmission gate.

The standard cell FF is disposed in proximity to the standard cell AA having an input gate to be protected during the auto-placement and auto-routing. The metal wiring line 10f is connected to a metal wiring line 10, i.e., an input line, of the standard cell AA connected to the input gates of the MOS transistors T1 and T2.

Although the junction of an n-type diffused region 6 included in the transmission gate and the p-type wafer 1 forms a diode, or the junction of the p-type diffused region 12 and an n-type well 3 forms a diode, no current will flow through the junction while the LSI circuit is in a normal operation.

If a large amount of electrons flow into the metal wiring line 10 during wafer processing, the electrons will flow through the diode into the p-type wafer 1 or the n-type well 3 having the opposite conductivity to that of the p-type wafer 1, so that the gate oxide films 7 of the MOS transistors T1 and T2 are not damaged.

Eighth Embodiment

Figure 17:
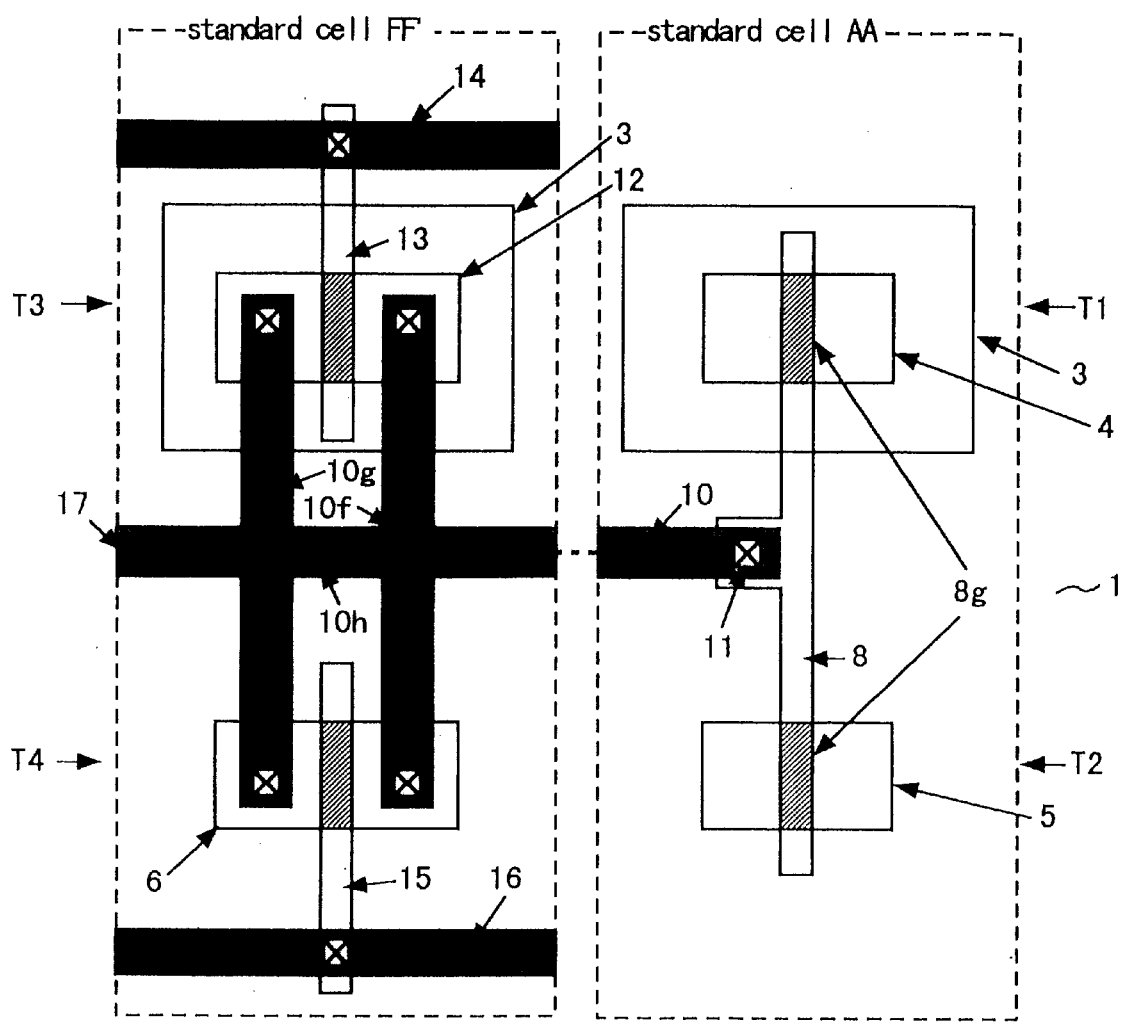
FIG. 17 shows a configuration of a semiconductor device according to an eighth embodiment of the present invention.

FIG. 17 shows a configuration of a semiconductor device according to an eighth embodiment of the present invention. FIG. 17 is a plan view showing a layout pattern of an additional standard cell newly added to an ordinary standard cell library.

The eighth embodiment is provided, in addition to the library of a standard cell AA as mentioned in the description of the first to the fourth embodiments, with another standard cell having a new transmission gate stated below:

As shown in FIG. 17, an additional standard cell FF' comprises a p-channel MOS transistor T3 and an n-channel MOS transistor T4, and has a transmission gate formed by connecting metal wiring lines 10f and 10g through a metal wiring line 10h so as to short-circuit an input terminal and an output terminal. The configuration of the standard cell FF' is the same, except that the input and the output terminal are short-circuited, as that in the seventh embodiment shown in FIG. 16, and hence the description thereof will be omitted to avoid duplication.

The standard cell FF' is disposed in proximity to the standard cell AA having an input gate to be protected. Tthe metal wiring line 10f is connected to a metal wiring line 10, i.e., an input line, of the standard cell AA connected to the input gates of the MOS transistors T1 and T2.

Although the junction of an n-type diffused region 6 included in the transmission gate and a p-type wafer 1 forms a diode, or the junction of the p-type diffused region 12 and an n-type well 3 forms a diode, no current will flow through the junction while the LSI circuit is in a normal operation.

If a large amount of electrons flow into the metal wiring line 10 during wafer processing, the electrons will flow through the diode into the p-type wafer 1 or the n-type well 3 the having an opposite conductivity to that of the p-type wafer 1, so that the gate oxide films 7 of the MOS transistors T1 and T2 are not damaged.

Ninth Embodiment

Figure 18:
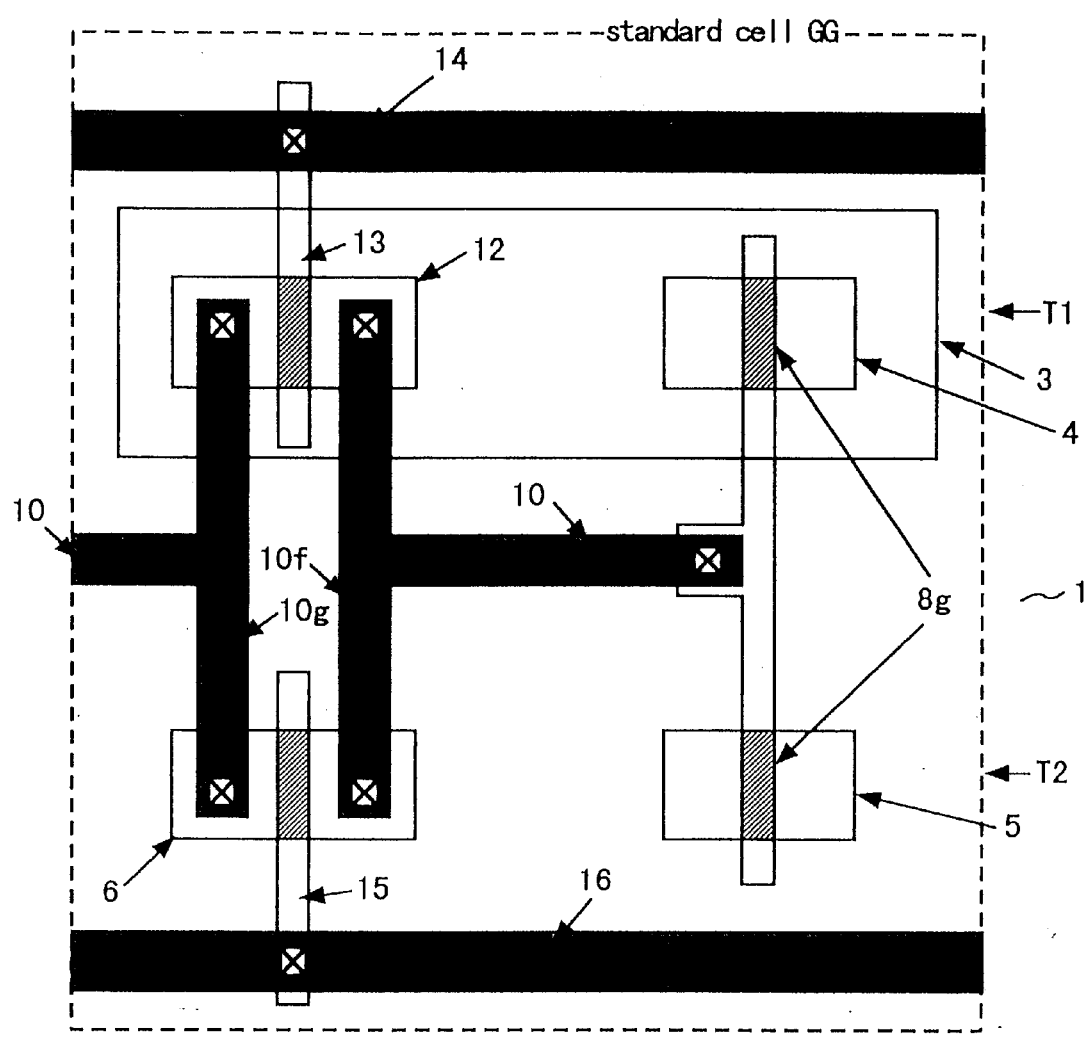
FIG. 18 shows a configuration of a semiconductor device according to a ninth embodiment of the present invention.

FIG. 18 shows a configuration of a semiconductor device according to a ninth embodiment of the present invention. FIG. 18 is a plan view showing a layout pattern of the standard cell.

In the ninth embodiment, a standard cell GG having an input gate to be protected includes a transmission gate formed by connecting a gate line 13 included in a p-channel MOS transistor T3 to a grounding line 14, and by fixing a gate line 15 included in an n-channel MOS transistor T4 to a power line 16. A metal wiring line 10f is connected to the gates of the MOS transistors T1 and T2 through a metal wiring line 10 serving as an input line for MOS transistors T1 and T2.

Although the junction of an n-type diffused region 6 included in the transmission gate and a p-type wafer 1 forms a diode, or the junction of the p-type diffused region 12 and an n-type well 3 forms a diode, no current will flow through the junction while the LSI circuit is in a normal operation.

If a large amount of electrons flow into the metal wiring line 10 during wafer processing, the electrons will flow through the diode into the p-type wafer 1 or the n-type well 3 having an opposite conductivity to that of the p-type wafer 1, so that the gate oxide films 7 of the MOS transistors T1 and T2 are not damaged.

Thus, in the ninth embodiment, the transmission gate is incorporated in the standard cell, and is connected to the inputs of the MOS transistors in the standard cell.

Tenth Embodiment

Figure 19:
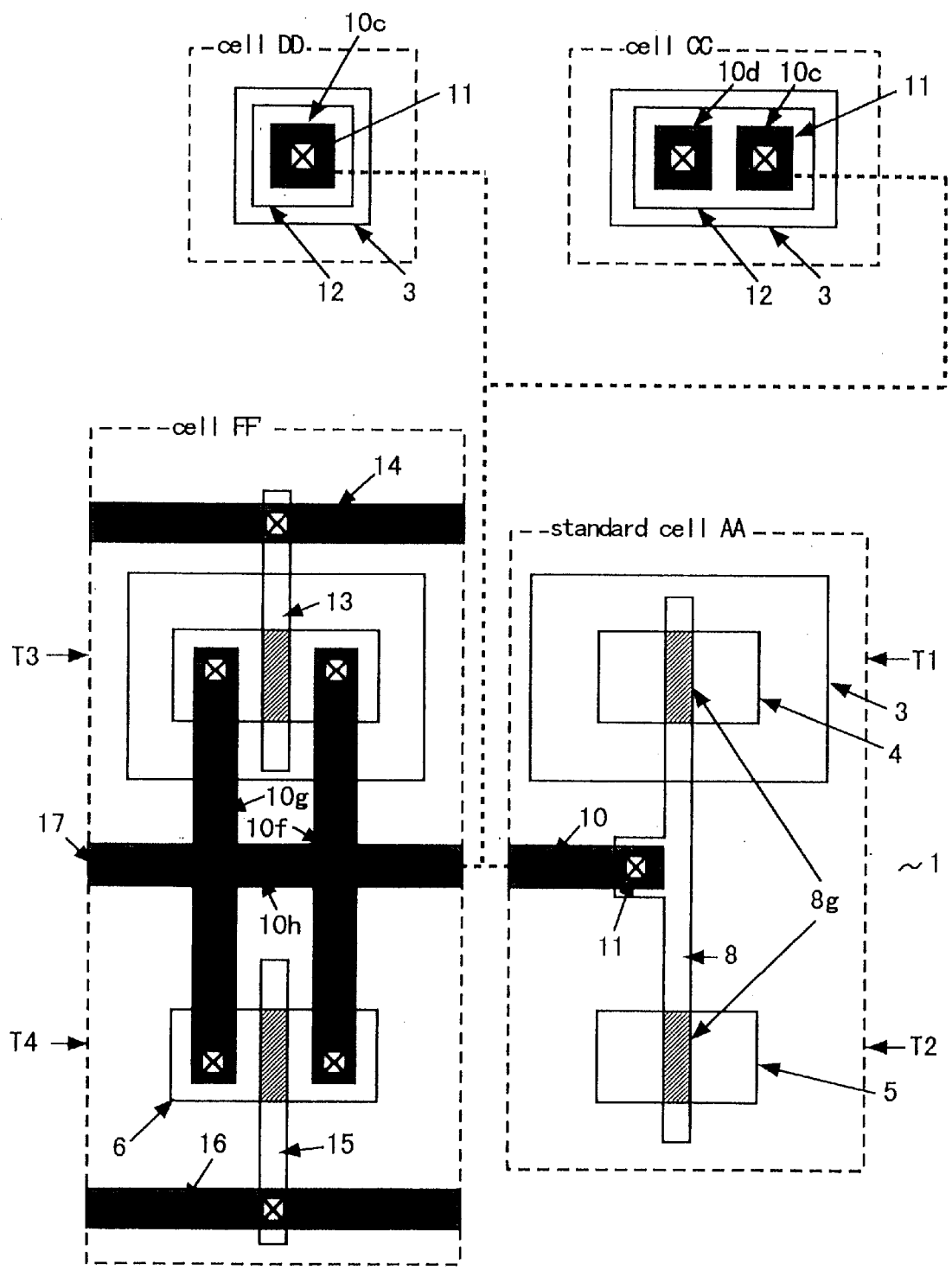
FIG. 19 shows a configuration of a semiconductor device according to a tenth embodiment of the present invention.

FIG. 19 shows a configuration of a semiconductor device according to a tenth embodiment in the present invention. FIG. 19 is a plan view showing a layout pattern produced by an automatic layout producing program, such as a symbolic layout program or a module generator program.

In the tenth embodiment, patterns of the standard cells CC and DD included in the fifth embodiment (FIG. 10) and a pattern of the standard cell FF' included in the eighth embodiment (FIG. 17) are formed in proximity to the gates of MOS transistors T1 and T2 as shown in FIG. 19 by an automatic layout producing program, such as a symbolic layout program or a module generator program.

FIG. 19 shows the pattern as an example. Any one of the layout patterns employed in the first to the ninth embodiments may be used or some of those layout patterns may be used in combination, thus an arbitrary pattern may be produced.

Any pattern for protecting the MOS transistors T1 and T2 is formed in this way, and is connected to the gates of the MOS transistors T1 and T2. The method of connection is as employed in the foregoing embodiments, and hence the description thereof will be omitted to avoid duplication.

Owing to the above-mentioned configuration, if a large amount of electrons flow into the metal wiring line 10 during wafer processing, the electrons will flow through the diode into a wafer 1 or a well 3 having the opposite polarity to that of the wafer 1, so that the gate oxide films of the MOS transistors are not damaged.

Eleventh Embodiment

Figure 20:
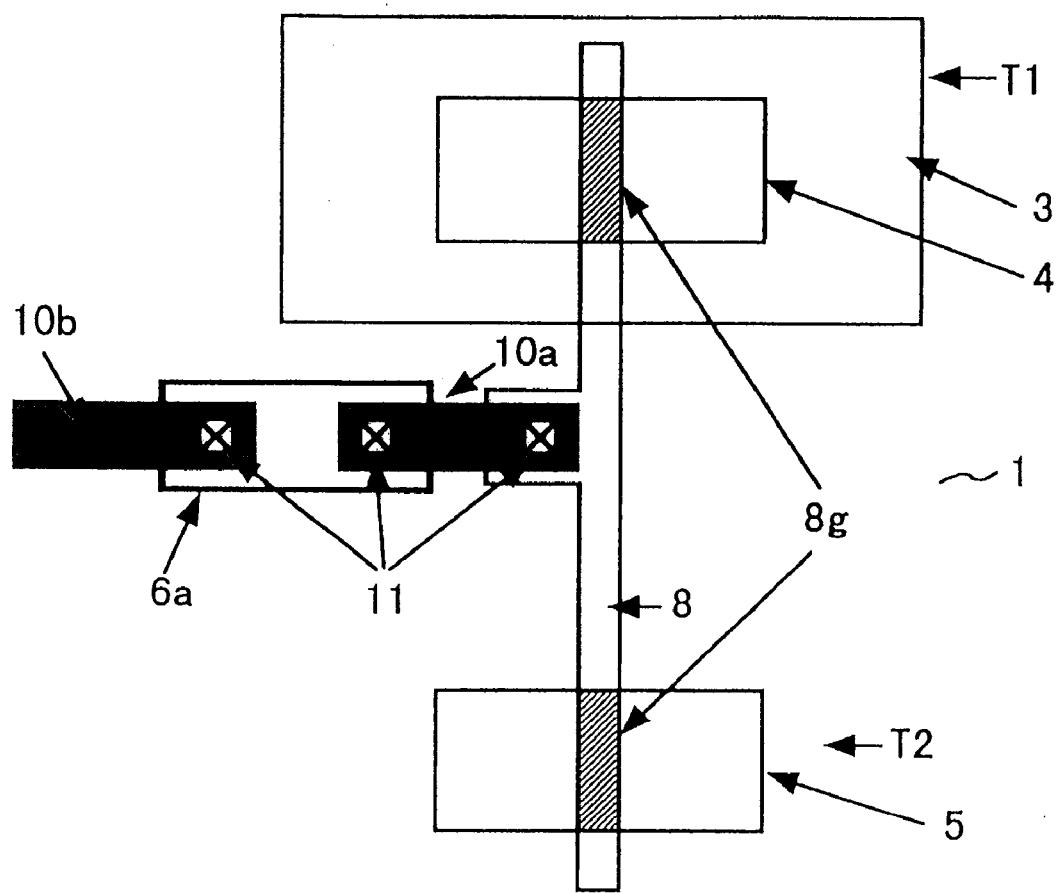
FIG. 20 shows a configuration of a semiconductor device according to an eleventh embodiment of the present invention.

FIG. 20 shows a configuration of a semiconductor device according to an eleventh embodiment of the present invention. In FIG. 20, indicated at 6a is a silicidized n-type diffused region. The eleventh embodiment is the same in other respects as the first embodiment, and hence the further description thereof will be omitted to avoid duplication.

The eleventh embodiment employs the method of silicidizing the diffused region 6 connected to the input gate in the first embodiment so as to further decrease the resistance component to an extent that can be neglected in terms of circuit operation.

The method of silicidizing the diffused region connected to the input gate can also be employed equally in the third, the fifth and the tenth embodiments as well as the first embodiment.

Since the resistance component is thus decreased, the influence on wire delay time is reduced during a real operation of the LSI. If a large amount of electrons flow into the metal wiring line, the electrons will flow through the diode into a wafer 1 or a well 3 of the opposite polarity to that of the wafer 1, so that the gate oxide films 7 of the MOS transistors T1 and T2 are not damaged.

Twelfth Embodiment

Figure 21:
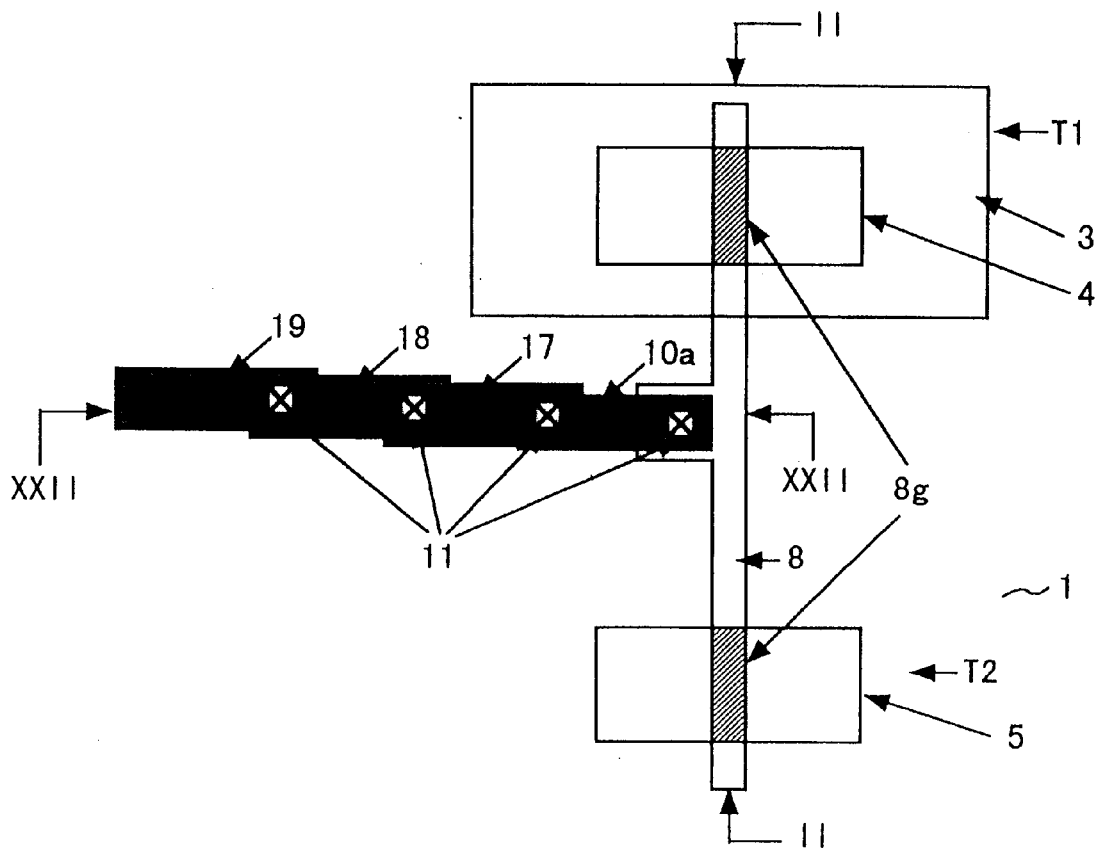
FIGS. 21 and 22 show a configuration of a semiconductor device according to a twelfth embodiment of the present invention.
Figure 22:
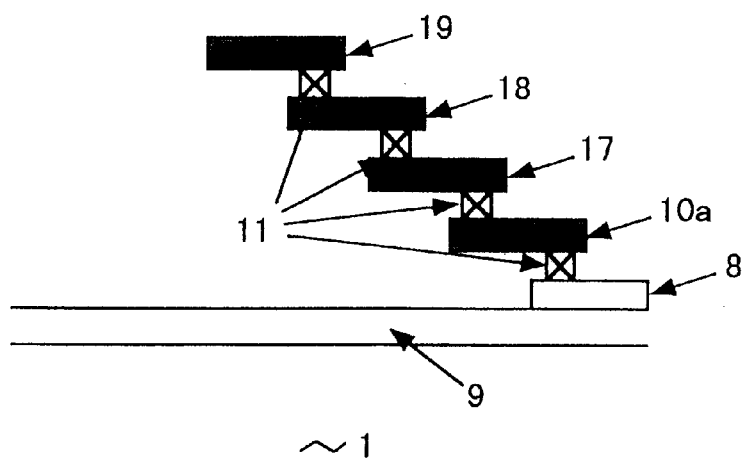
Figure 23:
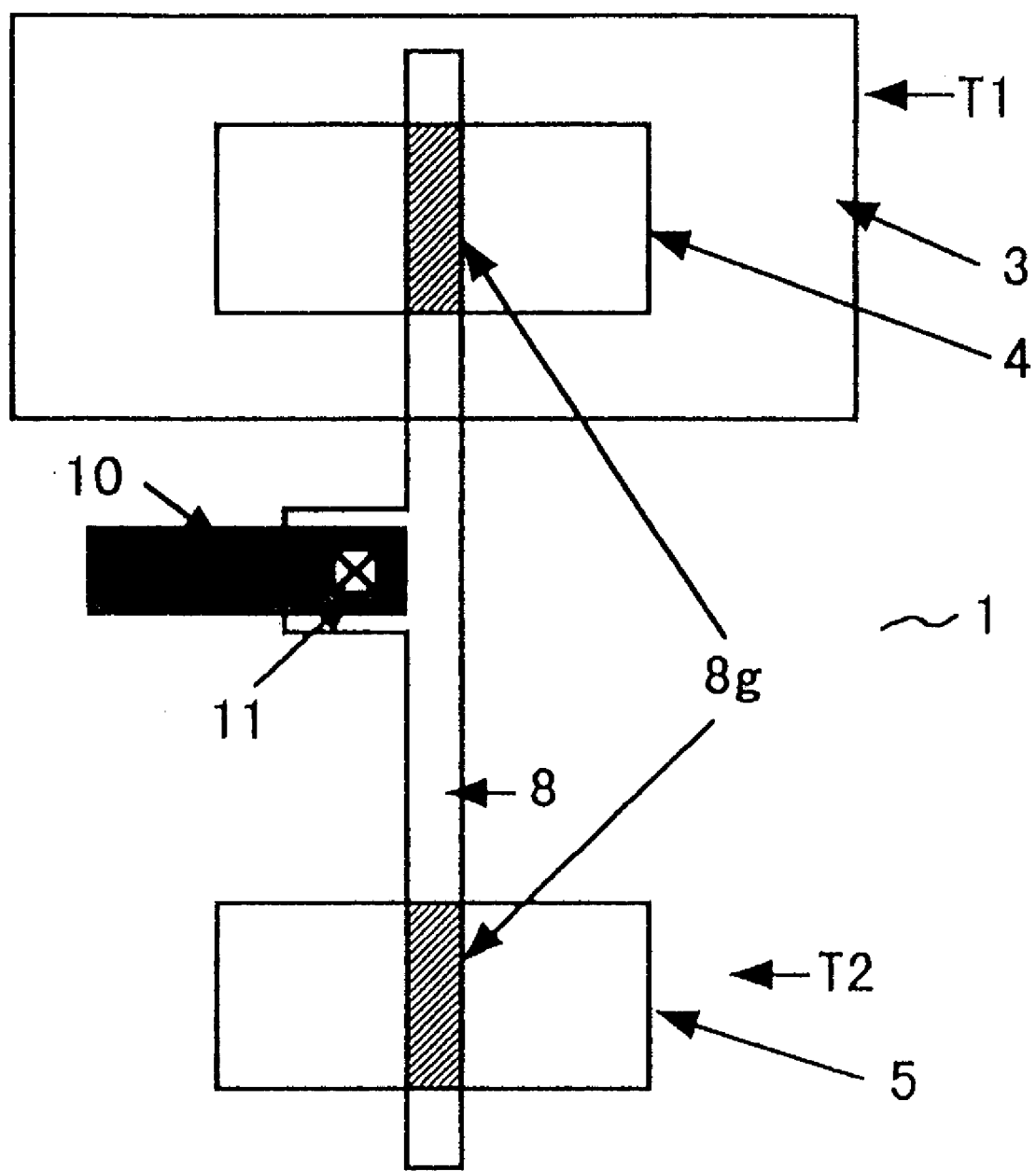
FIG. 23 is a plan view showing a conventional standard cell layout pattern employed in auto-placement and auto-routing for a semiconductor device comprising a plurality of standard cells.

FIGS. 21 and 22 show a configuration of a semiconductor device according to a twelfth embodiment of the present invention. FIG. 21 is a plan view showing a layout pattern of a standard cell and metal wiring lines, and FIG. 22 is a sectional view taken on XXII—XXII line in FIG. 21. A sectional view taken on II—II line in FIG. 21 is the same as that shown in FIG. 2.

Referring to FIGS. 21 and 22, metal wiring lines 17, 18 and 19 in each layer are formed with an interlayer insulating film (the illustration is abbreviated) sandwiched therebetween, and metal wiring lines 10a, 17, 18, and 19 are connected by contact holes (or contacts) 11, respectively. The metal wiring lines 17 and 18 are short wiring lines in an intermediate layer, and the metal wiring line 19 is a long wiring line in the uppermost layer of the semiconductor device.

When fabricating a standard cell for the twelfth embodiment, a metal wiring line connected to the gates of the MOS transistors to be protected is formed in the uppermost wiring layer; that is, for example, the output line of the preceding standard cell is connected to the input line of the succeeding standard cell by a metal wiring line formed in the uppermost wiring layer.

Accordingly, the gates of the MOS transistors of the standard cell to be protected are not connected to a long wiring pattern formed outside the standard cell at the time of wafer processing other than a process for forming the uppermost wiring layer, and hence will not be damaged by a plasma.

Since the gates to be protected are connected necessarily to the diffused regions of other transistors when the connection up to the uppermost wiring layer is completed, the gates are not damaged by a plasma even at the time of a wafer process for forming the uppermost wiring layer. Namely, the uppermost wiring layer, for example, is connected to the source/drain of the output transistor in the preceding standard cell, and consequently it turns out that the gates are connected to the diffused region of the source/drain.

Accordingly, the gates to be protected are not damaged by a plasma in all the processes for processing the wafer.

The effects and advantages of the present invention may be summarized as follows.

As is apparent from the foregoing description, according to the present invention, a diffused region is formed in a substrate including a standard cell or in the well formed in the substrate, and the metal wiring line connected to a gate of a MOS transistor in the standard cell is electrically connected to the diffused region. This, during a wafer processing for the metal wiring layer, allows a large amount of electrons to dissipate into the substrate (including the wells formed thereon) and thus enables the gates to be protected. Electrons, flowing into the metal wiring layer from a plasma during processes such as an etching of the metal and a removal of the resist, will flow into the gates of the MOS transistors through the wiring layer, and will not destroy the gate oxide film.

As a result, according to the present invention, in a semiconductor device including a plurality of standard cells, a gate of the MOS transistor in each standard cell may not be damaged by a plasma. Such a semiconductor device and a method of designing thereof are obtained.

It is further understood that the foregoing description is a preferred embodiment of the disclosed device and that various changes and modifications may be made in the invention without departing from the spirit and scope thereof.

What is claimed is:

1. A semiconductor device comprising:
   a standard cell formed on a substrate and having at least a MOS transistor and an input line for the MOS transistor; and
   a plurality of independent standard cells disposed near said standard cell, each of the independent standard cells having:
      at least one metal wiring line,
      at least one contact hole; and
      a diffused region protecting a gate of the MOS transistor by dissipating surplus electrons into the substrate, the electrons flowing into said metal wiring line during the processing,
   wherein the input line of said standard cell and said at least one metal wiring line of one of said plurality of independent standard cells are connected when an area or a circumferential length of the metal wiring line of said one of the plurality of independent standard cells connected to the input line of the standard cell is damaged by a plasma.

* * * * *